United States Patent [19]

Yoda et al.

[11] Patent Number: 5,427,888

[45] Date of Patent: * Jun. 27, 1995

[54] POSITIVE PHOTOSENSITIVE RESIN COMPOSITION COMPRISING A POLYMER HAVING CARBON-CARBON DOUBLE BONDS, A MALEIC ACID GROUP AND A MALEIMIDE GROUP

[75] Inventors: Eiji Yoda; Hitoshi Yuasa; Yutaka Otsuki, all of Yokohama, Japan

[73] Assignee: Nippon Oil Co., Ltd., Tokyo, Japan

[*] Notice: The portion of the term of this patent subsequent to May 2, 2012 has been disclaimed.

[21] Appl. No.: 101,176

[22] Filed: Aug. 3, 1993

[30] Foreign Application Priority Data

Aug. 7, 1992 [JP] Japan ................... 4-211524

[51] Int. Cl.⁶ .................... G03F 7/023; G03F 7/30
[52] U.S. Cl. .................... 430/192; 430/165; 430/190; 430/191; 430/193; 430/910
[58] Field of Search ........... 430/191, 192, 193, 165, 430/910, 190

[56] References Cited

U.S. PATENT DOCUMENTS

| | | | |
|---|---|---|---|
| 4,023,973 | 5/1977 | Imaizumi et al. | 430/910 |
| 4,663,268 | 5/1987 | Turner et al. | 430/190 |
| 4,720,445 | 1/1988 | Brahim et al. | 430/192 |
| 4,845,009 | 7/1989 | Kita et al. | 430/176 |
| 5,002,858 | 3/1991 | Demmer et al. | 430/192 |
| 5,055,374 | 10/1991 | Seio et al. | 430/190 |
| 5,059,513 | 10/1991 | Hopf et al. | 430/326 |
| 5,068,168 | 11/1991 | Lee | 430/270 |
| 5,212,043 | 5/1993 | Yamamoto et al. | 430/192 |

*Primary Examiner*—Charles L. Bowers, Jr.
*Assistant Examiner*—John S. Chu
*Attorney, Agent, or Firm*—Darby & Darby

[57] ABSTRACT

A positive photosensitive resin composition contains 50 to 95 parts by weight of a resin (a) composed of a high molecular compound (A) having a molecular weight of 300 to 30,000 and an iodine value of 50 to 500 and containing carbon-carbon double bonds and a group represented by the formula (I)

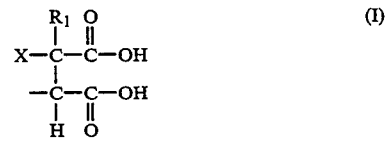

wherein
$R_1$ denotes a hydrogen atom, a halogen atom or an alkyl group having 1 to 3 carbon atoms and X denotes a hydrogen atom or a bond, on the proviso that if X denotes the bond, a carbon atom linked to $R_1$ and a carbon atom linked to a hydrogen atom together form a portion of a main chain of the high molecular compound (A), and a group represented by the formula (II)

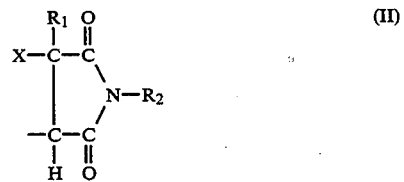

wherein $R_1$ and X denote the same as above, and $R_2$ denotes an alkyl, cycloalkyl or aryl group, and 5 to 50 parts by weight of a compound (b) containing quinone diazide groups.

20 Claims, No Drawings

POSITIVE PHOTOSENSITIVE RESIN COMPOSITION COMPRISING A POLYMER HAVING CARBON-CARBON DOUBLE BONDS, A MALEIC ACID GROUP AND A MALEIMIDE GROUP

BACKGROUND OF THE INVENTION

This invention relates to a novel positive photosensitive resin composition which may be employed for preparation of a printed wiring board or the like. More particularly, it relates to a novel positive photosensitive resin composition which exhibits superior long-term stability of an electrodepositing solution and which may be deposited on a substrate for forming a superior coating film thereon.

In keeping up with the recent development of electronic equipments, high density, higher integration and fine circuit designing are demanded of a printed circuit board as a support member. Consequently, for mounting components on a substrate, a surface mount system in which through-holes of smaller diameter are bored in the substrate for electrical conduction across the front and back sides of the substrate has been accepted as a mounting system. The through-holes have the inner wall surfaces plated with metal for interconnecting the circuits on the front and back sides of the substrate and for securing the components mounted on the substrate.

When preparing such printed circuit boards having these through-holes and fine interconnects, it is necessary to protect even the inner wall surfaces of the through-holes from an etching solution. However, with a method of laminating a photosensitive film, known as a dry film, on the substrate surface, which is a method employed nowadays extensively, since the film itself generally has a larger thickness of the order of 50 μm, a sharp circuit pattern cannot be produced on exposure to light and development. In addition, difficulties are presented in laminating the dry film uniformly on the metal surface. Above all, the through-holes with a smaller diameter cannot be coated with the photosensitive film.

If with a method of uniformly applying an etching resist by electrodeposition, a conventional negative electrodeposition photoresist, consisting essentially of a photocurable resin, is employed, a sufficient amount of light cannot be radiated into the inside of the through-hole so that the resin cannot be cured sufficiently within the through-hole and hence it is difficult to protect the electrically conductive layer within the inner wall of the through-hole against the etching solution. For overcoming such deficiency, investigations are currently conducted towards developing a positive photoresist in which an unexposed portion serves as a protective layer. Besides, investigations are also conducted towards developing a positive electrdepositive photoresist which may be applied uniformly on the substrate by electrodeposition coating.

With the use of the positive photoresist, since a resist portion irradiated with light is dissolved in a developing solution, while an unirradiated resist portion, which is insoluble in the developing solution, is left as a protective layer without being removed, it becomes possible to form a protective layer without the necessity of irradiating the inner surfaces of the through-holes with light.

While a number of functional groups have been proposed as photosensitive groups capable of affording these properties to the positive resist, it is a quinone diazide group that is most excellent in sensitivity and resolution. Such difference in solubility between the exposed portion and the non-exposed portion of the positive photoresist, which is correlated with difference in photosensitivity, may be realized when dissolution promoting groups and the quinone diazide groups are present at a suitable ratio in the resist. The positive photoresist exhibits high photosensitivity if these two functional groups are contained in one and the same resin or in separate resins. However, the resin having both groups contained therein is not desirable from the viewpoint of industry in that it is difficult to purify despite superior stability of the electrodeposition solution. If a compound containing quinone diazide groups and a resin containing dissolution promoting groups, that is an alkali-soluble resin, are mixed together at a moderate ratio to give a positive photoresist, it is crucial to improve compatibility of the two components to realize high resolution and stability of the electrodeposition solution.

Thus, an alkali-soluble resin having one of dicarboxylic acid groups esterified has been proposed in Japanese Laid-Open Patent Application No. 4-96067 (1992). However, the long-term stability of the electrodeposition solution stored at room temperature for six months is lowered due to changes in compatibility between the compound containing quinone diazide groups which are oleophilic and the resin containing dissolution promoting groups, thus lowering the resolution. Besides, the alkali-soluble resin undergoes hydrolysis to adversely affect developability of the solution.

SUMMARY OF THE INVENTION

It is an object of the present invention to provide a positive photosensitive resin composition exhibiting high compatibility between the alkali-soluble resin and the compound containing quinone diazide groups, high stability of the electrodeposition solution and high resolution.

The above and other objects of the invention will become apparent from the following description.

According to the present invention, there is provided a positive photosensitive resin composition comprising 50 to 95 parts by weight of a resin (a) composed of a high molecular compound (A) having a molecular weight of 300 to 30,000 and an iodine value of 50 to 500 and containing carbon-carbon double bonds and a group selected from the group consisting of a group represented by the formula (I)

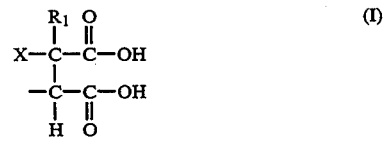

wherein $R_1$ denotes a hydrogen atom, a halogen atom or an alkyl group having 1 to 3 carbon atoms and X denotes a hydrogen atom or a bond, on the proviso that if X denotes the bond, a carbon atom linked to $R_1$ and a carbon atom linked to a hydrogen atom together form a portion of a main chain of the high molecular compound (A), a group represented by the formula (II)

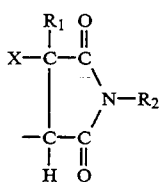

wherein $R_1$ denotes a hydrogen atom, a halogen atom or an alkyl group having 1 to 3 carbon atoms, $R_2$ denotes an alkyl group having 1 to 10 carbon atoms, a cycloalkyl group having 1 to 10 carbon atoms or an aryl group having 1 to 10 carbon atoms, and X denotes a hydrogen atom or a bond, on the proviso that if X denotes the bond, a carbon atom linked to $R_1$ and a carbon atom linked to a hydrogen atom together form a portion of a main chain of the high molecular compound (A), and a mixture thereof, introduced into said high molecular compound (A), and 5 to 50 parts by weight of a compound (b) containing quinone diazide groups.

PREFERRED EMBODIMENTS OF THE INVENTION

The present invention will be explained in more detail hereinbelow.

The resin (a) employed in the present invention is a resin in which there is introduced into the specific high molecular compound (A) a group having the formula (I)

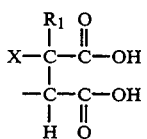

referred to herein as group (I), and/or a group having the formula (II)

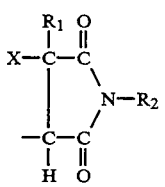

referred to herein as group (II), wherein $R_1$ denotes a hydrogen atom, a halogen atom or an alkyl group having 1 to 3 carbon atoms, $R_2$ denotes an alkyl group having 1 to 10 carbon atoms, a cycloalkyl group having 1 to 10 carbon atoms or an aryl group having 1 to 10 carbon atoms, and X denotes a hydrogen atom or a bond, on the proviso that if X denotes the bond, a carbon atom linked to $R_1$ and a carbon atom linked to a hydrogen atom together form a portion of the main chain of the high molecular compound (A).

If the number of carbon atoms of $R_1$ exceeds 3 or if the number of carbon atoms of $R_2$ exceeds 10, it becomes difficult to produce he resin (a).

The high molecular compound (A) is an organic high molecular compound containing carbon-carbon double bonds and having a molecular weight ranging between 300 and 30,000 and preferably between 500 and 5,000 and an iodine value ranging between 50 and 500 and preferably between 100 and 470. If the molecular weight exceeds 30,000, a light irradiated portion of the resulting composition is lowered in solubility with a developing solution, whereas if it is lower than 300, the protective layer is lowered in strength. On the other hand, if the iodine value is less than 50, the amount of the groups (I) or (II) introduced into the compound (A) becomes insufficient and the desired favorable effects cannot be produced, whereas if it exceeds 500, the composition is lowered in storage stability.

The high molecular compound (A) may be exemplified by, for example, natural oils and fats, such as linseed oil, tung oil, soybean oil or dehydrated castor oil; or so-called stand oil obtained by heat treatment of these natural oils and fats for increasing their molecular weight; low polymers of conjugated diolefins, such as butadiene, isoprene or piperylene; low polymerization degree copolymers of two or more of these conjugated diolefins; and low polymerization degree copolymers of one or more of these conjugated diolefins with vinyl monomers containing ethylenic unsaturated groups, more specifically, aliphatic or aromatic vinyl monomers, such as isobutylene, diisobutylene, styrene, α-methylstyrene, vinyl toluene or divinylbenzene. These may be used alone or in combination.

According to the present invention, the proportion of the groups (I) and/or (II) introduced into the high molecular compound (A) is preferably 0.05 to 1.0 mol and more preferably 0.1 to 0.7 mol to 100 g of the high molecular compound (A). If the amount of the groups (I) and/or (2) is less than 0.05 mol, the light irradiated portion of the composition is difficultly dissolved, whereas if it exceeds 1.0 mol, the non-irradiated portion thereof is also dissolved.

There is no particular limitation to the method of introducing the group (I) and/or (II) if it allows the groups (I) and/or (II) to be introduced into the high molecular compound (A). For example, the resin may be prepared by the following method.

First, the group (I) may be introduced into the high molecular compound (A) by addition reaction of a dicarboxylic acid represented by the formula (III)

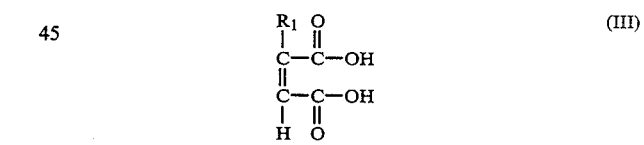

where $R_1$ has the same meaning as R of the group (I), or by addition reaction of a dicarboxylic anhydride represented by the formula (IV)

where $R_1$ has the same meaning as $R_1$ of the group (I), to the high molecular compound (A), followed by the ring opening of the anhydride with water. It is noted that there is no necessity of carrying out the ring-opening reaction of carboxylic anhydride with water because such ring opening is spontaneously incurred at the time of water dispersion or on imidization as later described. Dicarboxylic acids represented by the formula (III) may be exemplified by, for example, maleic acid and citraconic acid, while dicarboxylic anhydrides represented by the formula (IV) may be exemplified by, for example, maleic anhydride and citraconic anhydride.

The addition reaction may usually be carried out by mixing at a temperature of 100° to 300° C. and, for example, by a method described in Japanese Patent Publication No.46-11195 (1971). During the addition reaction, phenylene diamines, pyrogallols, naphthols, etc. may be mixed into the reaction system to prevent gelation of the reaction mass. If two or more of the high molecular compounds (A) are employed, the compounds may be mixed with one another after carrying out the addition reactions separately or the high molecular compounds (A) may be mixed together to carry out the addition reaction subsequently.

The group (II) may preferably be introduced into the high molecular compound (A) by a method involving reacting a primary amine-containing compound with a part or all of the introduced group (I) for imidization. The primary amine-containing compounds may be primary amines and may preferably be enumerated by compounds containing aromatic rings capable of lowering viscosity of a coating film before and after light irradiation and improving compatibility of the resulting resin (a) with the component (b), as described subsequently, such as aniline, benzyl amine, 4-methylbenzyl amine, m-methoxybenzyl amine, 1-aminoindene, or 1-naphthalene methyl amine. These amino compounds are reacted at a temperature preferably of 0° to 300° C. and more preferably of 50° to 200° C.

With the resin (a) employed in the present invention, it is preferred to employ a high molecular compound (A) into which both of the groups (I) and (II) are introduced. In such case, the group (I) is contained usually in an amount of 10 to 60 mol % and preferably in an amount of 20 to 50 mol % based on the sum of the groups (I) and (II), while the group (II) is contained usually in an amount of 40 to 90 mol % and preferably in an amount of 50 to 80 mol % based on the sum of the groups (I) and (II).

The addition reaction and the imidizing reaction may also be carried out using a suitable solvent. Although any solvent which will not adversely affect the reaction may be employed, it is preferred to use such solvents free of hydroxyl groups, such as diethylene glycol dimethylether or triethylene glycol dimethylether.

The component (b) is a compound containing quinone diazide groups. These quinone diazide groups may preferably be exemplified by groups having the following formulas:

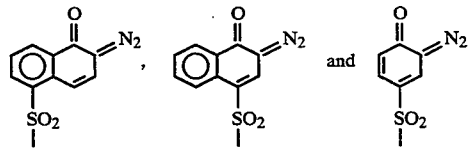

There is no limitation to the quinone diazide-containing compounds if these contain the above-mentioned quinone diazide groups. Specifically, these compounds may be exemplified by esterified products of trihydroxy benzophenones, such as 2,3,4-trihydroxy benzophenone, or 2,3,6-trihydroxy benzophenone, or tetrahydroxy benzophenones, such as 2,3,4,5-tetrahydroxy benzophenone or 2,3,4,4'-tetrahydroxy benzophenone, with one or more quinone diazide compounds selected from the formulas (V), (VI) and (VII):

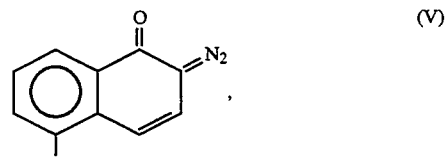

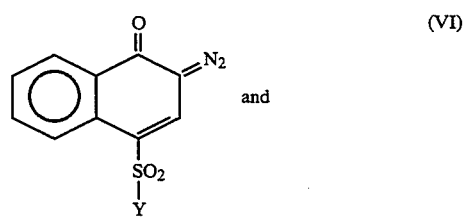

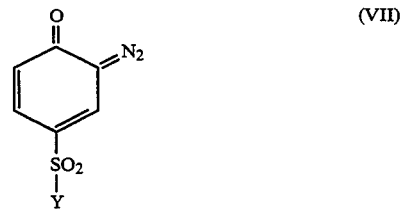

where Y denotes a hydrogen atom or a halogen atom.

The above-mentioned esterified product may be produced by publicly known methods as described in Japanese Laid-open Patent Application Nos. 59-172455 (1984) and 64-90250 (1989). Specifically, the esterified products may be prepared by condensation reaction of usually 1 to 4 mols and preferably 1.5 to 3.7 mols of a quinone diazide compound represented by the above formulas (V) to (VII) to one mol of the above-mentioned trihydroxy benzophenones or tetrahydroxy benzophenones in the presence of an amine.

The compositional ratios of the components (a) and (b), which are indispensable components of the positive photoresist composition of the present invention, are 50 to 95 parts by weight, preferably 60 to 90 parts by weight and more preferably 70 to 90 parts by weight of the component (a) and 5 to 50 parts by weight, preferably 10 to 40 parts by weight and more preferably 10 to 30 parts by weight of the component (b). If the amount of the component (b) is less than 5 parts by weight, the amount of carboxylic acid formed at the light irradiated portion of the composition is so small to render development by a weakly alkaline developing solution to be difficult. On the other hand, if the component (b) exceeds 50 parts by weight, the coating film tends to be cracked and besides, the composition is lowered in solubility.

In employing the positive photosensitive resin composition of the present invention, the composition is dissolved in a solvent and applied in this state on a substrate to form a positive photosensitive coating film. A desired pattern mask is then applied tightly in vacuum on the produced coating film and developed on exposure to light. The solvents which may be employed may be enumerated by alcohols such as ethyl cellosolve, propyl cellosolve, butyl cellosolve and diacetone alcohol; ethers such as ethylene glycol dimethyl ether and diethylene glycol dimethyl ether; ketones such as methyl ethyl ketone and methyl isobutyl ketone; esters such as ethoxy ethyl acetate and phenoxy ethyl acetate; and amides such as methyl pyrrolidone and dimethyl formamide. The solution may be applied to the substrate by screen printing, spraying or immersion coating or with the use of a spinner. Use of the spinner is suitable for the production of an integrated circuit because the film thickness may be reduced and a resist may be obtained which exhibits high sensitivity and superior adhesiveness with respect to the substrate.

The positive photosensitive resin composition of the present invention may be rendered water-soluble by neutralization with an organic or inorganic base followed by dispersion or dissolution in water. The positive photosensitive resin composition thus solubilized in water may be applied on an electrically conductive material by an electrodeposition method. There is no particular limitation to the method for neutralization and, as an example, the photosensitive resin composition may be admixed with an inorganic or organic base, specifically, an inorganic base such as sodium carbonate, sodium hydroxide, potassium carbonate or potassium hydroxide, or an organic amine, such as trimethyl amine, triethyl amine or dimethyl ethanol amine, in an amount usually of 0.2 to 1.0 mol equivalent and preferably 0.3 to 0.8 mol equivalent to carboxylic groups in the composition, for neutralization. There is no limitation to the neutralization temperature, which may usually be 0° to 120° C. and most preferably around ambient temperature.

After neutralization, an organic solvent which is soluble in water and capable of dissolving the resin components contained in the composition may be added for promoting solubilization in water and improving stability of the resulting aqueous solution or dispersion. The organic solvents may be enumerated by ethyl cellosolve, propyl cellosolve, butyl cellosolve, ethylene glycol dimethyl ether, diethylene glycol dimethyl ether, diacetone alcohol and methl ethyl ketone. These may be used alone or in combination. The organic solvents may be employed in an amount preferably of 10 to 100 parts by weight and most preferably of 20 to 80 parts by weight to 100 parts by weight of the positive photosensitive resin composition. An organic solvent which is hydrophobic and capable of dissolving the resin components contained in the composition may also be added to the composition for improving its dry flow characteristics following the electrodeposition. These hydrophobic organic solvents include hexyl cellosolve, phenyl cellosolve, propylene, glycol monophenyl ether, acetophenone, acetonaphthone, benzyl acetone, benzyl acetate, methyl benzoate, ethyl benzoate, butyl benzoate, cyclohexanone and phenoxyethyl acetate. The proportion of the hydrophobic organic solvent, if used, is preferably 10 to 100 parts by weight and most preferably 15 to 80 parts by weight to 100 parts by weight of the positive photosensitive resin composition.

A preferred example of the method for forming a picture using the above-mentioned positive photosensitive resin composition which has been neutralized and solubilized in water is explained.

The above-mentioned positive photosensitive resin composition, which has been neutralized and solubilized in water, is coated as an electrodeposition solution on a substrate by an electrodeposition method. Such substrate has through-holes formed therein and has its entire surface coated with an electrically conductive metal layer. The positive photosensitive resin composition may be coated on such substrate by immersing the substrate serving as an anode in the electrodeposition solution and by causing d.c. current to flow through the solution.

The film thickness of the positive photosensitive resin composition thus coated may be controlled easily to a desired value by controlling the solution temperature, current conduction time and the current density. An example of electrodeposition conditions for producing a typical film thickness of 5 to 20 μm includes a solution temperature of 25° C., a current conduction time of 0.05 to 10 minutes and the current density of 0.1 to 5.0 $mA/cm^2$ (constant current).

The substrate is then taken out of the electrodeposition solution and dried after washing with water. The drying temperature of 50° to 120° C. is preferred. The drying temperature of less than 50° C. is not desirable because sufficient drying cannot be achieved, whereas the drying temperature exceeding 120° C. is also not desirable because quinone diazide groups tend to be decomposed.

A desired pattern mask is contacted tightly under vacuum with the positive photosensitive coating film thus produced and irradiated with active rays such as UV rays. For light irradiation, a high-pressure mercury lamp, an ultra high-pressure mercury lamp, a xenon lamp or a metal halide lamp, may be employed.

For development, a weakly alkaline aqueous solution may be sprayed onto the substrate, or the substrate may be immersed in the weakly alkaline aqueous solution. There is no particular limitation to the weakly alkaline aqueous solution and any of the aqueous solutions of sodium carbonate, potassium carbonate, sodium metasilicate, potassium metasilicate, sodium hydroxide, potassium hydroxide or ammonia water, may be employed. The pH value of the weakly alkaline aqueous solution is preferably in a range of from 8 to 13.

If the substrate is a printed wiring board, a copper foil exposed thereon is etched using cupric chloride or ferric chloride and the positive photosensitive coating film is removed from the unexposed portion by strong alkali such as sodium hydroxide and potassium hydroxide for preparing a circuit pattern.

The positive photosensitive resin composition according to the preset invention is superior in sensitivity and stability of the electrodeposition solution and particularly suited to be applied by an electrdeposition coating because of excellent compatibility of the resin composed of the high molecular compound (A) and specified groups introduced therein with the quinone diazide compound. The photosensitive resin coating film produced by electrodeposition of the above-mentioned composition, is smooth and excellent in contact tightness with the substrate to permit an extremely fine pattern to be produced. Besides, the electrdeposition solution prepared from the positive photosensitive resin composition according to the present invention, is superior in dispersibility and long-term stability.

EXAMPLES OF THE INVENTION

The present invention is explained with reference to Examples and Comparative Examples. These Examples, however, are given only for illustration and are not intended for limiting the invention.

Synthesis Example 1

1000 g of polybutadiene (manufactured by NIPPON PETROCHEMICALS CO., LTD. under the trade name of "B-1000"; number average molecular weight, 1000; iodine value, 430; content of 1,2-linkage, 65%), 751 g of maleic anhydride, 5.0 g of an anti-gelating agent manufactured by SUMITOMO CHEMICAL CO., LTD. under the trade name of "ANTIGEN 6C", and 10 g of xylene, were charged into a separable flask of a 3 lit. capacity, fitted with a reflux cooling tube and a nitrogen blowing tube, and reaction was carried out under a nitrogen stream at 190° C. for five hours. Unreacted maleic anhydride and xylene were then removed to produce a maleinated polybutadiene polymer.

The total acid value of the maleinated polybutadiene thus prepared was measured and found to be 480 mgKOH/g. 500 g of the maleinated polybutadiene thus synthesized having the total acid value of 480 mgKOH/g, and 250 g of diethylene glycol dimethyl ether were charged into a separable flask fitted with a reflux cooling tube for uniform dissolution. Then, under a nitrogen stream, 148 g of benzylamine were added at 130° C. dropwise into the mixture over 30 minutes. After the end of the dropwise addition the reaction mixture was heated to 165° C. and the reaction was continued for seven hours while the temperature was maintained at 165° C. Thus, a resin solution containing 35 mol % of dicarboxylic groups and 65 mol % of imide groups based on the introduced maleic acid groups was produced. The resin solution thus produced had the non-volatile content of 72 wt % and contained 169 milligram equivalent of carboxylic acid groups per 100 g of the solution.

Synthetic Example 2

1000 g of polybutadiene (manufactured by NIPPON PETROCHEMICALS CO., LTD. under the trade name of "B-1000", 388 g of maleic anhydride, 5.0 g of an anti-gelating agent, manufactured by SUMITOMO CHEMICAL CO., LTD. under the trade name of "ANTIGEN 6C", and 10 g of xylene, were reacted in the same way as in Synthetic Example 1 to produce a maleinated polybutadiene.

The total acid value of the maleinated polybutadiene thus prepared was measured and found to be 320 mgKOH/g. 500 g of the maleinated polybutadiene thus synthesized having the total acid value of 320 mgKOH/g, 197 g of phenyl cellosolve and 174 g of diethylene glycol dimethyl ether were charged into a separable flask of 2 lit. capacity fitted with a reflux cooling tube for uniform dissolution. Reaction was continued at 130° C. for three hours under a nitrogen atmosphere to produce a resin solution containing half ester groups. The resin solution thus produced had the non-volatile content of 80 wt % and contained 164 milligram equivalent of carboxylic acid groups per 100 g of the solution.

Example 1

114 g of the resin solution synthesized in Synthetic Example 1, 18 g of an ester of 2,3,4-trihydroxy benzophenone with 1,2-naphthoquinone diazide sulphonyl chloride manufactured by TOYO GOSEI KOGYO CO., LTD. under the trade name of "NT-260", and 35 g of phenoxyethyl acetate were mixed together. Then, 7.5 g of triethyl amine were added to the reaction mixture and neutralized thoroughly. Deionized water was then added to the resulting mixture so as to give a solid content of 10% to produce an electrdeposition solution of the positive photosensitive resin composition.

A copper-lined laminated sheet for printed wiring having through-holes was immersed as an anode in the electrodeposition solution and a dc current with a current density of 2 mA/cm$^2$ was applied for 20 seconds. The laminated sheet was washed with water and dried at 100° C. for five minutes to produce an electrodeposited film of the positive photosensitive resin composition having a film thickness of 7 µm. A positive pattern photomask was applied in intimate contact with the electrodeposited film under vacuum and irradiated with UV rays with an exposure light volume of 300 mJ/cm$^2$. Development was then carried out by spraying a 1.0% aqueous solution of sodium carbonate at 30° C. for 60 seconds. The protective layer thus produced had a line width equal to the pattern line width, while pinholes or exfoliation or cracking of the protective layer were not observed. After etching copper with a ferric chloride solution, the resulting product was immersed for 60 seconds in a 4% sodium metasilicate maintained at 40° C. for removing the protective layer. Thus, a defect-free circuit pattern having a line width of 30 µm was produced. The copper within the through-holes was protected from the etching solution and left intact. After the electrodeposition solution was allowed to stand at room temperature for six months, no resin components were precipitated and the electrodepostion solution could be repeatedly used without any unusualties being rendered manifest.

Comparative Example 1

111 g of an acrylic resin manufactured by TOUAGOSEI CHEMICAL INDUSTRY LTD. under the trade name of "S-4030", which was a butyl cellosolve solution with a solid content of 60%, 18 g of an ester of 2,3,4-trihydroxy benzophenone with 1,2-naphthoquinone diazide sulphonyl chloride manufactured by TOYO GOSEI KOGYO CO., LTD. under the trade name of "NT-260", and 35 g of phenoxyethyl acetate, were mixed together. 7.5 g of triethyl amine were then added to the reaction mixture and neutralized thoroughly. Deionized water was then added to the resulting mixture so as to give a solid content of 10% to produce an electrdeposition solution of the positive photosensitive resin composition.

Electrodeposition, light exposure and development were carried out in the same way as in Example 1. The electrodeposition solution thus produced was poor in smoothness and sheen. The line resolution of the protective layer produced after light exposure and development could not be improved over 60 µm. The protective layer thus produced had a line width equal to the pattern line width, while pinholes, exfoliation or cracking of the protective layer were not observed. After etching copper with a ferric chloride solution, the resulting product was immersed for 60 seconds in a 4% sodium metasilicate maintained at 40° C. for removing the protective layer. Thus a circuit pattern having a line width of 60 µm with no defects was produced. The copper within the through-holes was protected from the etching solution and left intact. After the electrodeposition solution was allowed to stand at room temperature for three months, precipitation of the resin components were observed. On electrodepositon, the solution could not be deposited to have a predetermined film thickness.

Comparative Example 2

75 g of the resin solution synthesized in Synthetic Example 2 and 20 g of an ester of 2,3,4-trihydroxy benzophenone with 1,2-naphthoquinone diazide sulphonyl chloride manufactured by TOYO GOSEI KOGYO CO. LTD. under the trade name of "NT-260" were dissolved in 28 g of triethylene glycol dimethyl ether and mixed together. Then, 6 g of triethyl amine were added to the reaction mixture and neutralized thoroughly. Deionized water was then added to the resulting mixture so as to give a solid content of 12% to produce an electrdeposition solution of the positive photosensitive resin composition.

A copper-lined laminated sheet for printed wiring having through-holes as immersed as an anode in the electrodeposition solution and a 40 V dc current was applied for 3 minutes. The laminated sheet was washed with water and dried at 100° C. for five minutes to produce an electrodeposited film of the positive photosensitive resin composition having a film thickness of 7 μm. A positive pattern photomask was applied in intimate contact with the electrodeposited film under vacuum and irradiated with UV rays having a wavelength of 365 nm and a light exposure volume of 300 mJ/cm². The sheet having the electrodeposited film thereon was immersed in a 1.5% aqueous solution of sodium metasilicate maintained at 30° C. for 30 seconds for development. The protective layer thus produced had a line width faithful to the pattern line width while pinholes or exfoliation or cracking in the protective layer were not observed. After etching copper with a ferric chloride solution, the resulting product was immersed for 60 seconds in a 4% sodium metasilicate maintained at 40° C. for removing the protective layer. Thus a circuit pattern having a line width of 30 μm was produced. The copper within the through-holes was protected from the etching solution and left intact. No changes were observed after the electrodeposition solution was allowed to stand at room temperature for three months. However, after the solution was allowed to stand for six months at room temperature, precipitation of the resin components was observed. On electrodepositon, the solution could not be deposited to a predetermined film thickness.

Although the present invention has been described with reference to the preferred examples, it should be understood that various modifications and variations can be easily made by those skilled in the art without departing from the spirit of the invention. Accordingly, the foregoing disclosure should be interpreted as illustrative only and is not to be interpreted in a limiting sense. The present invention is limited only by the scope of the following claims.

What is claimed is:

1. A positive photosensitive resin composition comprising, in admixture:
   50 to 95 parts by weight of a resin (a) composed of a high molecular compound (A) having a molecular weight of 300 to 30,000, and an iodine value of 50 to 500, and containing carbon-carbon double bonds and a group represented by the formula (I)

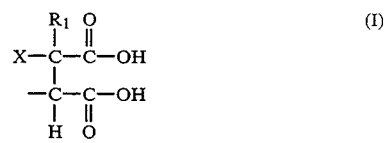

wherein $R_1$ denotes a hydrogen atom, a halogen atom or an alkyl group having 1 to 3 carbon atoms and X denotes a hydrogen atom or a bond, on the proviso that if X denotes a bond, a carbon atom linked to $R_1$ and a carbon atom linked to a hydrogen atom together form a portion of a main chain of said high molecular compound (A), and a group represented by the formula (II)

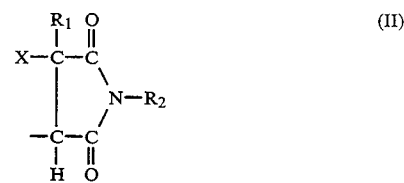

wherein $R_1$ denotes a hydrogen atom, a halogen atom or an alkyl group having 1 to 3 carbon atoms, $R_2$ denotes an alkyl group having 1 to 10 carbon atoms, a cycloalkyl group having 1 to 10 carbon atoms or an aryl group having 1 to 10 carbon atoms, and X denotes a hydrogen atom or a bond, on the proviso that if X denotes the bond, a carbon atom linked to $R_1$ and a carbon atom linked to a hydrogen atom together form a portion of a main chain of said high molecular compound (A); and
   5 to 50 parts by weight of a compound (b) containing quinone diazide groups.

2. The composition as claimed in claim 1 wherein said high molecular compound (A) is selected from the group consisting of linseed oil, tung oil, soybean oil, dehydrated castor oil, stand oil and mixtures thereof.

3. The composition as claimed in claim 1 wherein said high molecular compound (A) is selected from the group consisting of low polymers of conjugated diolefins selected from the group consisting of butadiene, isoprene, piperylene and mixtures thereof, low polymerization degree copolymers of conjugated diolefins selected from the group consisting of butadiene, isoprene, piperylene and mixtures thereof and low polymerization degree copolymers of the conjugated diolefins with vinyl monomers containing ethylenic unsaturated groups selected from the group consisting of isobutylene, diisobutylene, styrene, a-methylstyrene, vinyl toluene, divinylbenzene, and mixtures thereof.

4. The composition as claimed in claim 1 wherein said high molecular compound (A) is a mixture of the high molecular compound (A) as claimed in claim 2 and the high molecular compound (A) as claimed in claim 3.

5. The composition as claimed in claim 1 wherein a proportion of the group introduced into said high molecular compound (A), selected from the group consisting of the group represented by the formula (I), the group represented by the formula (II) and mixtures thereof, is 0.05 to 1.0 mol based on 100 g of the high molecular compound (A).

6. The composition as claimed in claim 1 wherein the group represented by the formula (I) and the group represented by the formula (II) are introduced into said high molecular compound (A), and wherein a proportion of the group represented by the formula (I) and that of the group represented by the formula (II) amount to 10 to 60 mol % and 40 to 90 mol %, respectively based on total of the introduced groups.

7. The composition as claimed in claim 1 wherein said resin (a) is selected from the group consisting of a resin in which dicarboxylic acid represented by the formula (III)

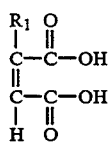
(III)

wherein $R_1$ denotes a hydrogen atom, a halogen atom or an alkyl group having 1 to 3 carbon atoms, is reacted by addition reaction with said high molecular compound (A) for introducing the group represented by the formula (I) into the high molecular compound (A), a resin in which dicarboxylic anhydride represented by the formula (IV)

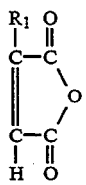
(IV)

wherein $R_1$ denotes a hydrogen atom, a halogen atom or an alkyl group having 1 to 3 carbon atoms, is reacted by addition reaction with said high molecular compound (A) and by subsequent ring-opening reaction with water for introducing the group represented by the formula (I) into the high molecular compound (A), a resin containing the group represented by the formula (II) produced by imidization by reacting a primary amine-containing compound with at least a portion of the group of the formula (I) in the resin having the group of the formula (I) introduced therein, and mixtures thereof.

8. The composition as claimed in claim 7 wherein said dicarboxylic acid is selected from the group consisting of maleic acid, citraconic acid and mixtures thereof.

9. The composition as claimed in claim 7 wherein said dicarboxylic anhydride is selected from the group consisting of maleic anhydride, citraconic anhydride and mixtures thereof.

10. The composition as claimed in claim 7 wherein said primary amine-containing compound is selected from the group consisting of aniline, benzyl amine, 4-methylbenzyl amine, m-methoxybenzyl amine, 1-aminoindene, 1-naphthalene methyl amine and mixtures thereof.

11. The composition as claimed in claim 1 wherein said compound (b) containing the quinone diazide groups is an esterified product of hydroxy benzophenones selected from the group consisting of 2,3,4-trihydroxy benzophenone, 2,3,6-trihydroxy benzophenone, 2,3,4,5-tetrahydroxy benzophenone and 2,3,4,4'-tetahydroxy benzophenone, with a quinone diazide compound selected from the group consisting of the formulas (V), (VI) and (VII):

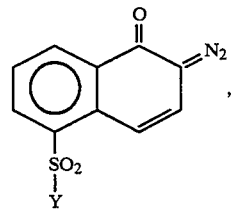
(V)

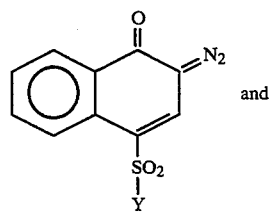
(VI)

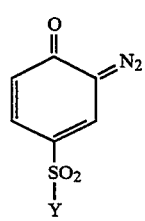
(VII)

where Y represents a hydrogen atom or a halogen atom, and mixtures thereof.

12. The composition as claimed in claim 11 wherein said esterified product is prepared by reacting 1 to 4 mols of said quinone diazide compound with 1 mol of said hydroxy benzophenones in the presence of amine by way of condensation reaction.

13. The composition as claimed in claim 1 wherein the composition is neutralized with a base selected from the group consisting of an organic base and an inorganic base and solubilized in water.

14. The composition as claimed in claim 13 wherein said inorganic base is selected from the group consisting of sodium carbonate, sodium hydroxide, potassium carbonate, potassium hydroxide and mixtures thereof.

15. The composition as claimed in claim 13 wherein said organic base is selected from the group consisting of trimethyl amine, triethyl amine, dimethyl ethanol amine and mixtures thereof.

16. The composition as claimed in claim 13 wherein an amount of addition of said base is 0.2 to 1.0 mol equivalent based on an amount of the carboxylic acid groups in the composition.

17. The composition as claimed in claim 1 further comprising an organic solvent selected from the group consisting of ethyl cellosolve, propyl cellosolve, butyl cellosolve, ethylene glycol dimethyl ether, diethylene glycol dimethyl ether, diacetone alcohol, methyl ethyl ketone and mixtures thereof.

18. The composition as claimed in claim 17 wherein a content of said organic solvent is 10 to 100 parts by weight to 100 parts by weight of the composition free of the organic solvent.

19. The composition as claimed in claim 1 further comprising a hydrophobic organic solvent selected from the group consisting of hexyl cellosolve, phenyl cellosolve, propylene glycol monophenyl ether, acetophenone, acetonaphthone, benzyl acetone, benzyl acetate, methyl benzoate, ethyl benzoate, butyl benzoate, cyclohexanone, phenoxyethyl acetate, and mixtures thereof.

20. The composition as claimed in claim 19 wherein an amount of said hydrophobic organic solvent is 10 to 100 parts by weight to 100 parts by weight of the composition free of the hydrophobic organic solvent.

* * * * *